United States Patent [19]

Lin et al.

[11] Patent Number: 5,596,524
[45] Date of Patent: Jan. 21, 1997

[54] CMOS MEMORY CELL WITH GATE OXIDE OF BOTH NMOS AND PMOS TRANSISTORS AS TUNNELING WINDOW FOR PROGRAM AND ERASE

[75] Inventors: Jonathan Lin, Milpitas; Bradley A. Sharpe-Geisler, San Jose, both of Calif.

[73] Assignee: Advanced Micro Devices, Inc., Sunnyvale, Calif.

[21] Appl. No.: 427,117

[22] Filed: Apr. 21, 1995

[51] Int. Cl.$^6$ .......................... G11C 16/04; H01L 29/788
[52] U.S. Cl. ...................... 365/185.1; 365/185.08; 365/185.29; 257/315
[58] Field of Search .................. 365/185.01, 185.1, 365/185.29, 185.08; 257/315, 316

[56] References Cited

U.S. PATENT DOCUMENTS

| | | | |
|---|---|---|---|
| 4,142,251 | 2/1979 | Mintz | 365/181 |
| 4,686,558 | 8/1987 | Adam | 357/42 |
| 4,829,203 | 5/1989 | Ashmore, Jr. | 307/469 |
| 4,858,185 | 8/1989 | Kowshik et al. | 365/181 |
| 4,862,019 | 8/1989 | Ashmore, Jr. | 307/469 |
| 4,866,307 | 9/1989 | Ashmore, Jr. | 307/469 |
| 4,885,719 | 12/1989 | Brahmbhatt | 365/182 |
| 5,148,391 | 9/1992 | Zagar | 365/96 |
| 5,270,587 | 12/1993 | Zagar | 307/469 |
| 5,272,368 | 12/1993 | Turner | 257/315 |
| 5,404,328 | 4/1995 | Takemae | 365/185.1 |

FOREIGN PATENT DOCUMENTS

| | | | |
|---|---|---|---|
| 0103043 | 3/1984 | European Pat. Off. | H01L 29/60 |
| 0431911 | 6/1991 | European Pat. Off. | G11C 16/04 |

OTHER PUBLICATIONS

"Design and simulation of a high reliability non–volatile, CMOS EEPROM memory cell compatible with scaling-down trends", Int. J. Electronics, 1992, vol. 72, No. 1, 73–87, London, GB.

Primary Examiner—David C. Nelms
Assistant Examiner—Son Mai
Attorney, Agent, or Firm—Fliesler, Dubb, Meyer & Lovejoy

[57] ABSTRACT

A CMOS memory cell including a PMOS transistor and an NMOS transistor having a common floating gate with a gate oxide region of both the NMOS and PMOS transistors providing a tunneling window for program and erase. The PMOS and NMOS transistors of the CMOS memory cell are biased so that only the PMOS transistor is utilized during programming and only the NMOS transistor is utilized during erase to prevent depletion of the substrate beneath the tunneling oxide regions. The CMOS memory cell further includes a separate PMOS pass transistor for supplying a program voltage to the source of the PMOS transistor underlying the common floating gate, so that an NMOS threshold does not have to be added to the program voltage.

8 Claims, 5 Drawing Sheets

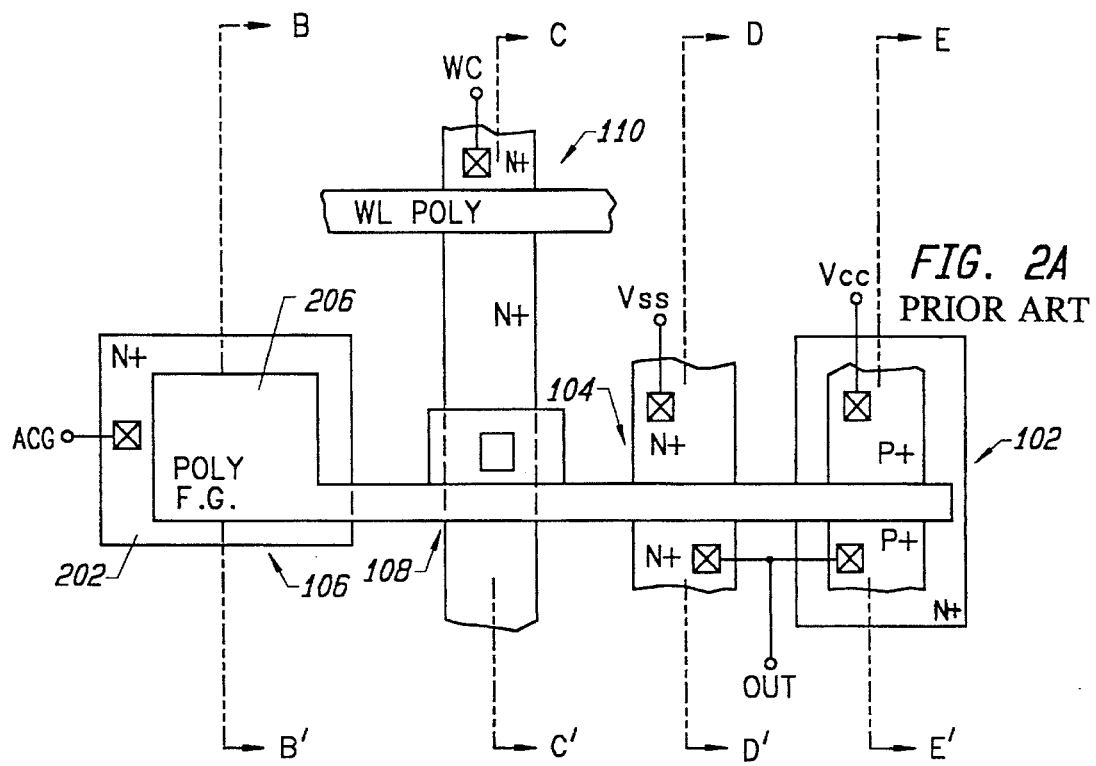
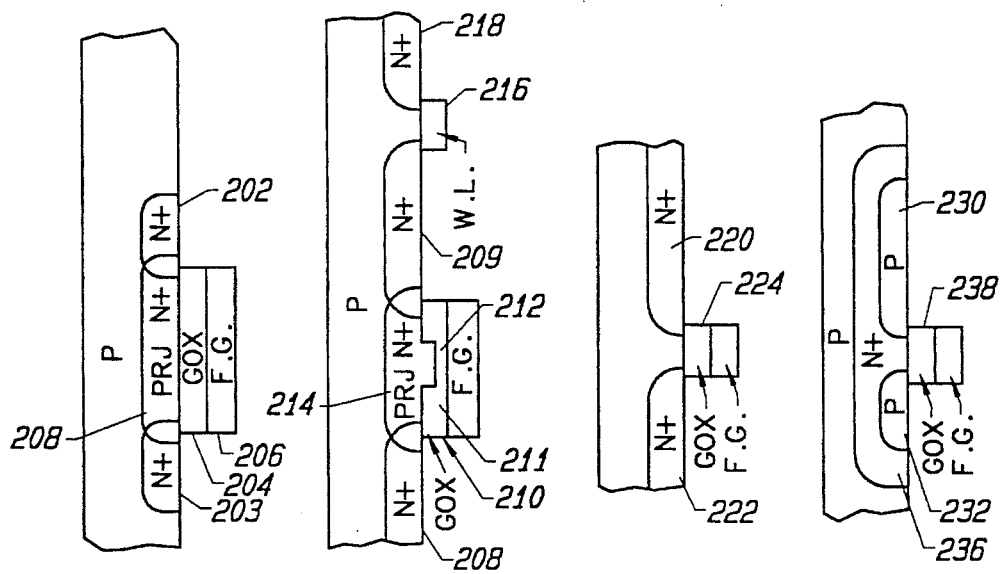
FIG. 2B
PRIOR ART
FIG. 2C
PRIOR ART
FIG. 2D
PRIOR ART
FIG. 2E
PRIOR ART

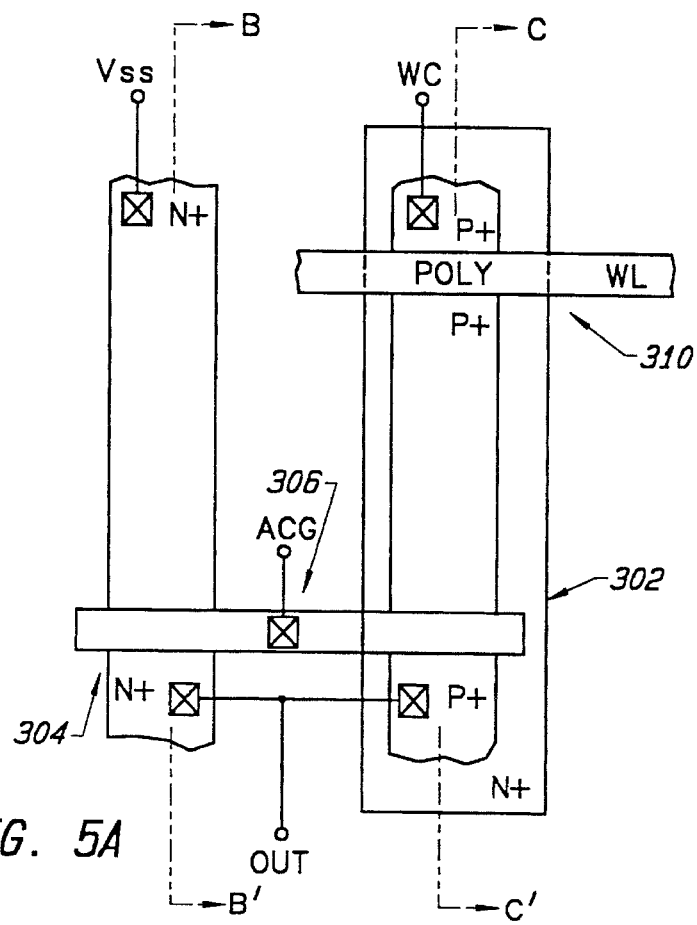
FIG. 5A
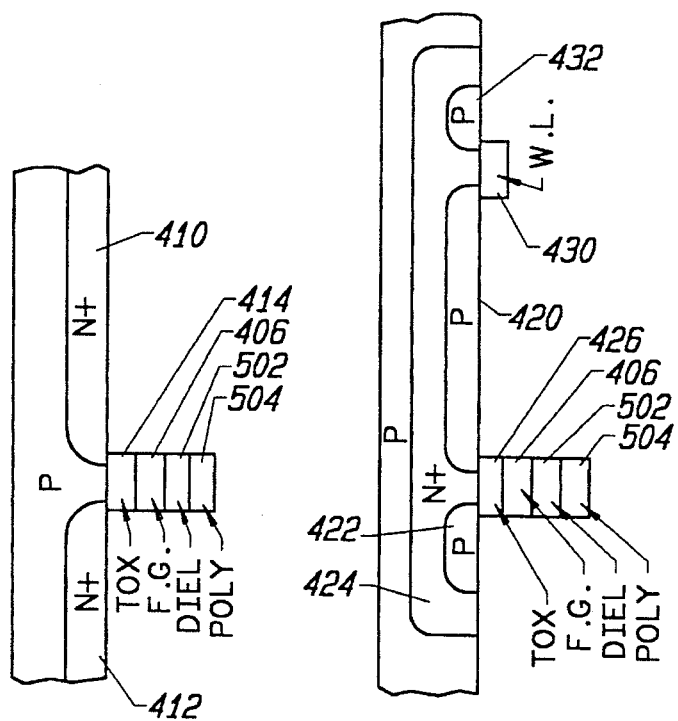
FIG. 5B
FIG. 5C 5,596,524

CMOS MEMORY CELL WITH GATE OXIDE OF BOTH NMOS AND PMOS TRANSISTORS AS TUNNELING WINDOW FOR PROGRAM AND ERASE

BACKGROUND OF THE INVENTION

1. Field of The Invention

The present invention relates to CMOS memory cells having PMOS and NMOS transistors with a common floating gate. More particularly, the present invention relates to a configuration allowing programming and erasing through the gate oxide of NMOS and PMOS transistors of a CMOS memory cell.

2. Description of the Related Art

FIG. 1 illustrates the configuration of a conventional CMOS memory cell 100 having a PMOS transistor 102 and an NMOS transistor 104 with a common floating gate. Drains of transistors 102 and 104 are connected together to form the output of the CMOS cell 100. Capacitors 106 and 108 are connected to couple voltage to the common floating gate. Bias voltage is provided to the source of PMOS transistor 102 from a chip Vcc pin. Bias voltage is provided to the source of the NMOS transistor 104 through a chip ground or Vss pin. Capacitor 106 supplies voltage from an array control gate (ACG) node. An NMOS pass transistor 110 supplies a word control (WC) voltage to capacitor 108 as controlled by a word line (WL) voltage supplied to its gate. The CMOS memory cell 100 is disclosed in U.S. Pat. No. 5,272,368 entitled "Complementary Low Power Non-Volatile Reconfigurable EECELL," and in U.S. Pat. No. 4,885,719 entitled "Improved Logic Cell Array Using CMOS E²PROM Cells."

Typical voltages applied for program, erase and read of the CMOS memory cell 100 are listed in Table I below. Programming indicates electrons are removed from the common floating gate, while erase indicates that electrons are added to the common floating gate.

TABLE I

|         | WC  | WL   | ACG  | Vcc | Vss |
|---------|-----|------|------|-----|-----|
| Program | 12  | 13.8 | 0    | 0   | 0   |
| Erase   | 0   | 5    | 13.8 | 12  | 12  |
| Read    | 2.5 | 5    | 2.5  | 5   | 0   |

FIG. 2A shows a layout for the CMOS cell 100 of FIG. 1, while FIGS. 2B–2E show respective cross sectional views at BB', CC', DD' and EE' in FIG. 2A. The layout for the CMOS cell shown in FIGS. 2A–2E is formed in a p type substrate.

As shown in FIGS. 2A and 2B, capacitor 106 includes n+ type implant regions 202 and 203 formed in the p type substrate. Overlying the n+ type implant regions 202 and 203 is a gate oxide layer (GOX) 204 approximately 150 Å thick. Provided above the gate oxide layer 204 is the common floating gate (F.G.) 206. With a p type substrate beneath the gate oxide 204, during application of a program voltage, with a higher voltage on the substrate than on the common floating gate, the p type region beneath the gate oxide can become depleted forming a p– type region, and preventing tunneling from the common floating gate. To prevent such depletion, additional n⁺ dopant is added to the substrate directly beneath gate oxide 204 to form a programming junction (PRJ) region 208 which will not be depleted during programming.

As shown in FIGS. 2A and 2C, capacitor 108 includes n+ implant regions 208 and 209 formed in the p type substrate. Overlying the n+ type implant regions 208 and 209 is a gate oxide 210 which includes a 150 Å portion 211 and a 85 Å portion 212. Overlying the gate oxide 210 is the common floating gate 206. The 85 Å portion 212 of the gate oxide 210 provides a tunneling oxide region to enable electrons to be applied to the floating gate 206 during erase and removed during programming. As with capacitor 106, capacitor 108 includes a programming junction region 214 to prevent depletion of the p type substrate during programming. The programming junction region 214 overlies both the 150 Å portion 211 and the 85 Å portion 212 of the tunneling oxide 210, even though the thin 85 Å portion 212 is significantly degraded when grown over a programming junction region, creating leakage current.

As further shown in FIGS. 2A and 2C, transistor 110 is formed by a polysilicon (POLY) word line (WL) region 216 on the substrate with a portion of region 216 overlying n+ implant region 209 and another portion overlying an additional n+ implant region 218.

As shown in FIGS. 2A and 2D, transistor 104 includes two n+ implant regions 220 and 222 in the p substrate. A gate oxide region 224 of approximately 150 Å is placed on the substrate bridging regions 222 and 220. The common floating gate 206 overlies the gate oxide region 224.

As shown in FIGS. 2A and 2E, transistor 102 includes two p type regions 230 and 232 included in a n+ type well 236 which is included in the p type substrate. A gate oxide region 238 of approximately 150 Å is placed on the substrate bridging the regions 230 and 232. The common floating gate 206 overlies the gate oxide region 238.

The CMOS memory cell 100 is advantageous because it enables zero power operation, zero power operation indicating that a component does not continually draw power when the component is not changing states. For instance, with an appropriate voltage applied to the common floating gate 206, PMOS transistor 102 will conduct and NMOS transistor 104 will not conduct. Current will then be provided from Vcc through PMOS transistor 102 to the output until the output is charged up to Vcc. In this configuration, no current will be provided through NMOS transistor 104 to Vss. Further, with another voltage applied to the common floating gate 206, NMOS transistor 104 will conduct while PMOS transistor 102 does not. The output will then discharge to Vss. No additional current will be provided through PMOS transistor 102 from Vcc to Vss.

Although the CMOS memory cell design of FIG. 1 enables zero power operation as described, the CMOS cell 100 is not typically included in an array of memory cells on an integrated circuit chip. CMOS memory cells have previously not been considered practical because the threshold of the PMOS transistor 102 is referenced to Vcc. With Vcc being a voltage supplied from an external source to a chip Vcc pin, unregulated variations in Vcc occur. Such variations in Vcc require that an unacceptably high voltage be applied to the common floating gate to assure PMOS transistor 102 can be turned off.

Recently, it has been discovered that by applying a regulated voltage from a voltage reference to the source of PMOS transistor 102, rather than directly from Vcc, use of a CMOS memory cell 100 becomes practical. U.S. patent application Ser. No. 08/426,741 entitled "Reference for CMOS Memory Cell Having PMOS and NMOS Transistors With a Common Floating Gate" filed Apr. 21, 1995, (hereinafter, the CMOS reference patent application), incorporated herein by reference, discloses such a reference for a CMOS memory cell.

SUMMARY OF THE INVENTION

The present invention enables elimination of one of the capacitors utilized in a conventional CMOS memory cell design, enabling an overall reduction in the CMOS memory cell size.

The present invention further enables elimination of a programming junction region from beneath the thin tunneling oxide region in a memory cell, preventing degradation of the tunneling oxide region and enabling a reduction in leakage current.

The present invention further utilizes a PMOS transistor to apply a programming voltage so that an NMOS threshold does not have to be added to the programming voltage.

The present invention is a CMOS memory cell including PMOS and NMOS transistors having a common floating gate and thin tunneling oxide regions provided beneath the common floating gate overlying a channel of each of the PMOS and NMOS transistors. The CMOS cell further includes a single capacitor connected to couple voltage from a control gate to the common floating gate. A separate PMOS pass transistor is connected to provide a bias voltage to the source of the PMOS transistor.

To program the CMOS memory cell of the present invention, a voltage is applied between the control gate of the capacitor and the source of the PMOS transistor so that electrons transfer from the common floating gate to the source of the PMOS transistor. A high impedance is applied to the source of the NMOS transistor to prevent depletion of its channel which would occur if an NMOS transistor were biased to remove electrons from the floating gate. By so biasing the NMOS and PMOS transistors during programming, a programming junction region is not necessary beneath the tunneling oxide region of the NMOS transistor.

To erase the CMOS memory cell of the present invention, a voltage is applied between the control gate of the capacitor and the source of the NMOS transistor so that electrons transfer from the source of the NMOS transistor to the common floating gate. A high impedance is applied to the source of the PMOS transistor to prevent depletion of its channel, which would occur if a PMOS transistor were biased to add electrons to the floating gate. By so biasing the NMOS and PMOS transistors during erase, a programming junction region is not necessary beneath the tunneling oxide region of the PMOS transistor underlying the common floating gate.

Because the present invention programs utilizing the PMOS cell underlying the common floating gate, by applying a programming voltage of approximately 12 V or less to the source of the PMOS cell through a separate PMOS pass transistor, the present invention avoids the need to add an NMOS threshold to the programming voltage as is required in conventional CMOS memory cell designs.

BRIEF DESCRIPTION OF THE DRAWINGS

Further details of the present invention are explained with the help of the attached drawings in which:

FIG. 2A shows the layout for the CMOS cell of FIG. 1;

FIGS. 2B–2E show respective cross sectional views at BB', CC', DD' and EE' in FIG. 2A;

FIGS. 5A–5C show modifications to the layout of FIGS. 4A–4D to utilize stacked polysilicon regions to reduce cell size.

DETAILED DESCRIPTION

Figure 3:
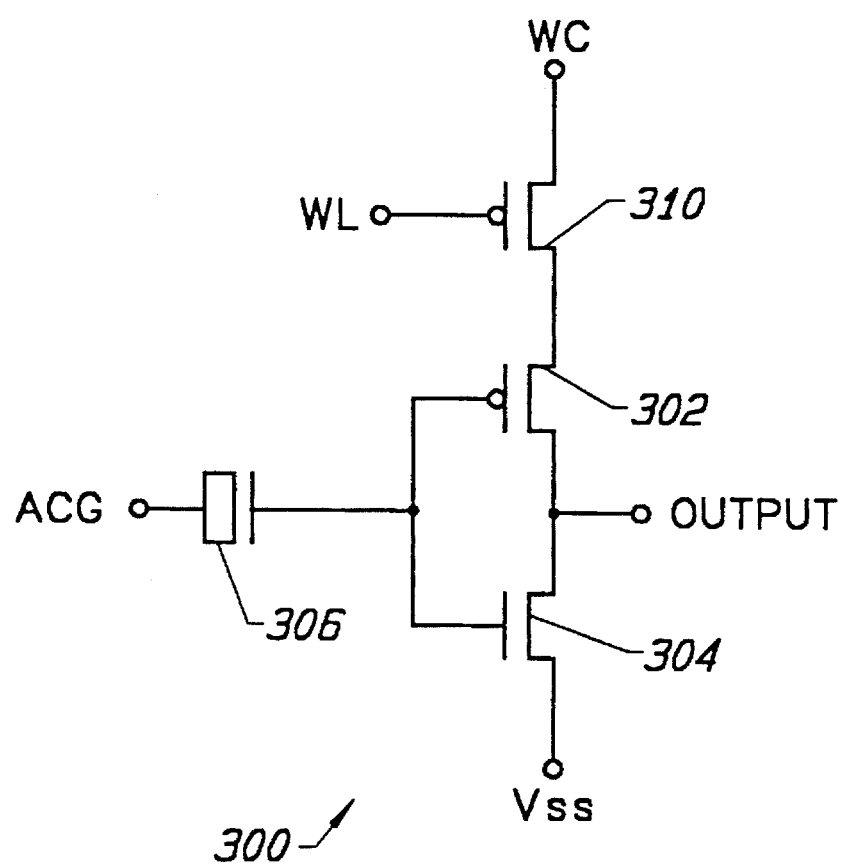
FIG. 3 shows circuitry for the CMOS memory cell of the present invention.

FIG. 3 shows circuitry for the CMOS memory cell 300 of the present invention. Like transistors 102 and 104 of FIG. 1 which share a common floating gate, CMOS memory cell 300 includes a PMOS transistors 302 and an NMOS transistor 304 which share a floating gate. As in the CMOS cell of FIG. 1, the drains of transistors 302 and 304 are coupled together to form the CMOS cell output. The CMOS cell 300 further includes a capacitor 306 connected between an array control gate (ACG) node and the floating gate. An additional PMOS pass gate transistor 310 has a drain connected to the source of PMOS transistor 302, a source connected to receive a word control (WC) voltage and a gate connected to receive a word line (WL) voltage.

Figure 1:
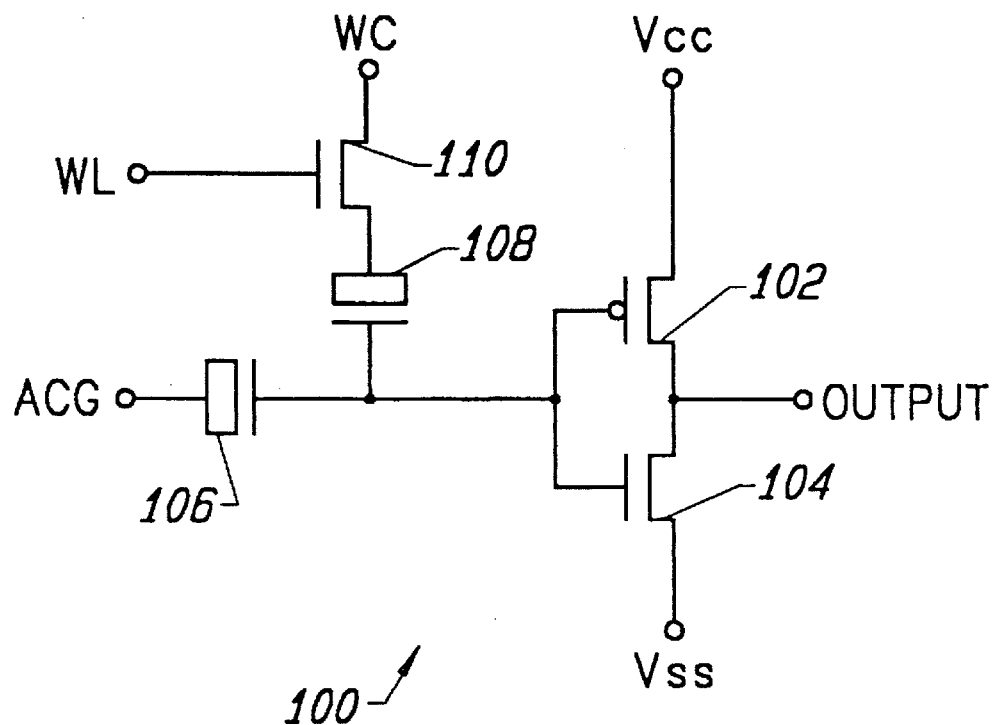
FIG. 1 illustrates the configuration of a conventional CMOS memory cell having a PMOS transistor and an NMOS transistor with a common floating gate.

Unlike the capacitors 106 and 108 utilized to program the floating gate in FIG. 1, the present invention utilizes only the capacitor 306. Instead of utilizing a second capacitor with a tunneling oxide region such as 108, the present invention provides tunneling oxide regions in the CMOS transistors 302 and 304 to enable programming of the floating gate. Elimination of an additional capacitor such as 108 of FIG. 1 and FIG. 2A enables a reduction in cell size in the present invention because additional space for the capacitor, which typically occupies the space of a transistor, is eliminated.

Figure 4A:
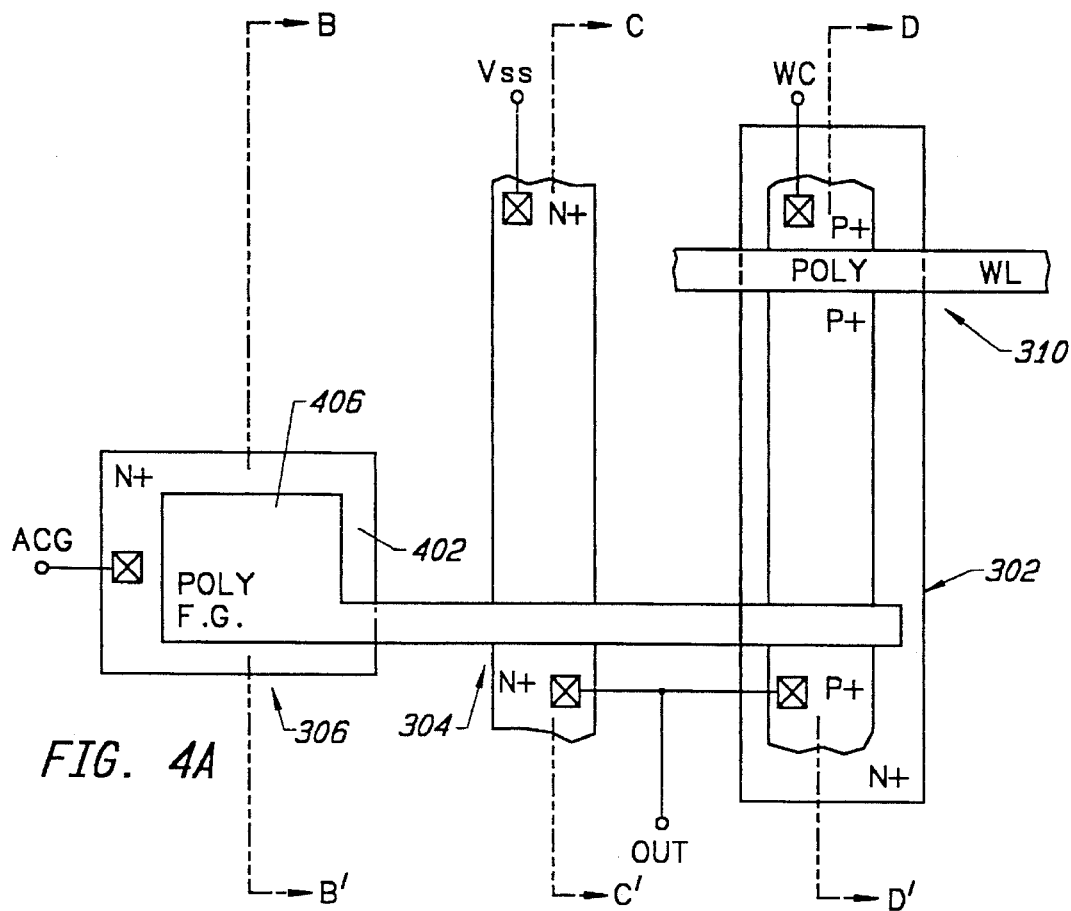
FIG. 4A shows the layout for the CMOS cell of FIG. 3.
Figure 4B:
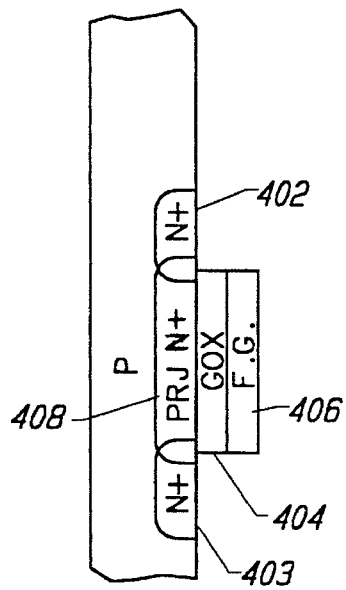
FIGS. 4B–4D show respective cross sectional views at BB', CC' and DD' in FIG. 4A.
Figure 4C:
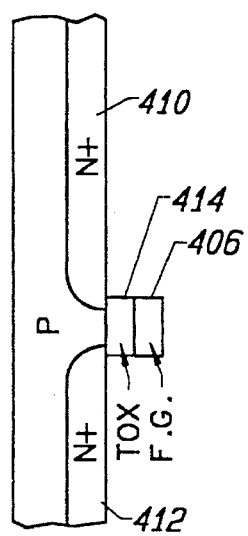
Figure 4D:
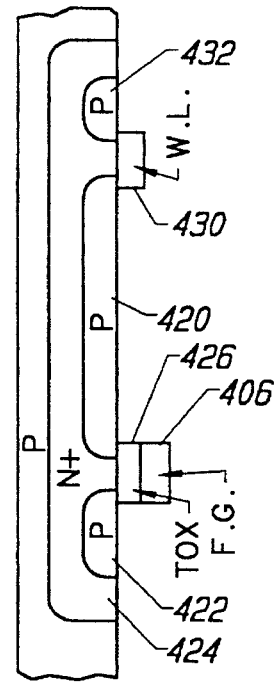

FIG. 4A shows the layout for the cell of FIG. 3, while FIGS. 4B–4D show respective cross sectional views at BB', CC' and DD' in FIG. 4A. The layout for the CMOS cell 300 shown in FIGS. 4A–4D is formed in a p-type substrate similar to the layout of FIGS. 2A–4E.

FIGS. 4A and 4B show the layout for capacitor 306, which is similar to the layout for capacitor 106 shown in FIGS. 2A and 2B. As shown, capacitor 306 includes n+ type implant regions 402 and 403 formed in the p type substrate. Overlying the n+ type implant regions 402 and 403 is a gate oxide layer (GOX) 404 approximately 150 Å thick. Provided above the gate oxide layer 404 is the common floating gate (F.G.) 406. With a p type substrate beneath the gate oxide 404, during application of a program voltage, with a higher voltage on the substrate than on the common floating gate, the p type region beneath the gate oxide can become depleted, forming a p$^-$ type region and preventing tunneling from the floating gate. To prevent such depletion, additional n$^+$ dopant is added to the substrate directly beneath gate oxide 404 to form a programming junction (PRJ) region 408 which will not be depleted during programming.

FIGS. 4A and 4C show the layout for NMOS transistor 304 for the CMOS memory cell 300. As shown, transistor 304 includes two n+ implant regions 410 and 412 in the p substrate. A tunnelling oxide region (TOX) 414 of approximately 85 Å is placed on the substrate bridging regions 410 and 412. The common floating gate 406 overlies the tunnelling oxide region 414.

FIGS. 4A and 4D show the layout for the PMOS transistors 302 and 310 for the CMOS memory cell 300. As shown, transistor 302 includes two p type regions 420 and 422 included in an n+ type well 424, which is included in the p type substrate. An additional tunneling oxide region (TOX) 426 of approximately 85 Å is placed on the substrate bridging the regions 420 and 422. The common floating gate 406 overlies the tunneling oxide region 426.

As further shown in FIGS. 4A and 4D, transistor 310 is formed by a polysilicon (POLY) word line (WL) region 430 on the substrate with a portion of region 430 overlying the p type implant region 420 and another portion overlying an additional p type implant region 432.

The present invention eliminates the programming junction (PRJ) implant region normally added beneath the tunneling oxide, such as 214 of FIG. 2C. Elimination of the programming junction region is realized with recognition that depletion in the channel of the NMOS transistor, which the programming junction region is utilized to prevent, only occurs with bias to create current flow in one direction, while depletion in the channel of the PMOS transistor occurs with current flow in the opposite direction.

FIGS. 5A–5C show modifications to the layout of FIGS. 4A–4D to utilize stacked polysilicon regions to reduce cell size. As shown in FIGS. 5A–5C, cell size is reduced because capacitor 306 occupies space overlying components of transistors 302 and 304. To form capacitor 306 in FIGS. 5A–5C, an interpolysilicon dielectric (DIEL) 502 is formed above the floating gate 406 of transistors 302 and 304 shown in FIGS. 4C and 4D. Further, an additional polysilicon region 504 is applied above the interpolysilicon dielectric 502 to which the ACG contact is attached. Although the configuration of FIGS. 5A–5C enables a reduced cell size, a disadvantage of additional manufacturing steps to create such stacked polysilicon regions may make the configuration of FIGS. 4A–4D more advantageous.

To program the CMOS memory cell 300, the present invention utilizes a voltage applied between the array control gate (ACG) node of capacitor 306 and the source of the PMOS transistor 302 so that electrons transfer from the common floating gate 406 to the source of the PMOS transistor 302. A high impedance is further applied to the source of the NMOS transistor 304 during programming to prevent depletion of its channel which would occur if an NMOS transistor 304 were biased to remove electrons from the common floating gate 406. By so biasing the NMOS and PMOS transistors during programming a programming junction region is not necessary beneath the tunneling oxide region of the NMOS transistor.

To erase the CMOS memory cell 300, the present invention utilizes a voltage applied between the array control gate (ACG) node of capacitor 306 and the source of the NMOS transistor 304 so that electrons transfer from the source of the NMOS transistor to the common floating gate 406. A high impedance is further applied to the source of the PMOS transistor 302 during erase to prevent depletion of its channel which would occur if a PMOS transistor 302 were biased to add electrons to the floating gate. By so biasing the NMOS and PMOS transistors during erase, a programming junction region is not necessary beneath the tunneling oxide region of the PMOS transistor.

Elimination of any programming junction region beneath the tunneling oxide regions of CMOS memory cell 300 improves the quality of the overlying thin tunneling oxide regions 414 and 426 and reduces leakage current and programmability.

Because programming is provided in the CMOS cell 300 of FIG. 3, utilizing transistors 302 and 304 in place of capacitor 108 in the CMOS cell 100 of FIG. 1, the transistor 110 from FIG. 1 is replaced in FIG. 3 with transistor 310. Transistor 310 is configured to receive WC and WL voltages to apply proper voltages for program, erase and read to the source of transistor 302. Transistor 310 is a PMOS device unlike transistor 110 to avoid having to increase voltage during programming above the threshold of an NMOS device. As shown in Table I, during programming of a conventional CMOS cell 100, a voltage during programming of 13.8 V is applied to the WL which is greater than the 12 V output voltage desired from transistor 110 by the threshold of the NMOS transistor.

Suggested voltages to apply to the CMOS memory cell 300 of FIG. 3 during program, erase and read are listed in Table II below.

TABLE II

|         | WC  | WL | ACG | Vss |
|---------|-----|----|-----|-----|
| Program | 12  | 5  | 0   | Hiz |
| Erase   | Hiz | 0  | 12  | 0   |
| Read    | 5   | 0  | 2.5 | 0   |

Note that the voltage applied to the WC during read is 5 V, while the ACG voltage is ½ the WC voltage, or 2.5 V. Because the CMOS cell 300 of FIG. 3 enables zero power operation, the CMOS cell can be utilized in a low power device, which during read will utilize a WC voltage of 3 V and an ACG voltage of ½ the WC voltage, or 1.5 V.

As discussed in the background, it has not previously been considered practical to use CMOS memory cells with a voltage Vcc supplied from an external pin of to the source of the PMOS transistor of the cells because of variations in Vcc. Consequently, the present invention further utilizes a voltage reference to supply the voltage WC to the source of PMOS transistor 302 in memory cell 300, as well as the ACG node voltage as described in the CMOS reference patent application discussed previously.

Further, in an embodiment of the present invention, cell implants are utilized in the PMOS transistor 302 and NMOS transistor 304 to assure maximum data retention in the CMOS cells as well as zero power operation throughout an integrated circuit. The cell implants include additional ion implantation to the channel between the source and drain of the PMOS and NMOS transistors 302 and 304 to alter the magnitude of the threshold of the PMOS and NMOS transistors.

In one embodiment of the present invention, cell implants are used to alter the magnitude of the thresholds of the PMOS and NMOS to correspond with a general reference, referred to in the CMOS reference patent application, which supplies a voltage approximately equal to Vcc, but more stable, as WC and applies ½ the WC voltage at the ACG node. With such a general reference, data retention of the CMOS cell 300 is improved by setting the magnitude of the thresholds of the PMOS and NMOS transistors 302 and 304 equal to ½ Vcc. With thresholds of the PMOS and NMOS transistors 302 and 304 set in this manner, only a minimal amount of charge needs to be added or removed from the floating gate of a cell to turn the CMOS cell on or off.

In another embodiment of the present invention, the magnitude of the thresholds of the PMOS and NMOS transistors 302 and 304 are raised to correspond with one of the references referred to in the CMOS reference patent application, referred to previously, which provides the WC voltage to CMOS cell 300 equal to the magnitude of the sum of the threshold of the PMOS and NMOS transistors 302 and 304, and an ACG voltage equal to the threshold of the NMOS transistor 304. With such a reference voltage applying WC less than Vcc, subsequent CMOS stages connected to the output of the CMOS memory cells will continually burn power. With cell implants utilized to raise the magnitude of the sum of the magnitudes of the thresholds of the PMOS and NMOS transistors equal to or above Vcc, zero power operation will be enabled in subsequent stages of an integrated circuit.

Although the invention has been described above with particularity, this was merely to teach one of ordinary skill in the art how to make and use the invention. Many modifications will fall within the scope of the invention, as that scope is defined by the claims which follow.

What is claimed is:

1. A memory cell comprising:

a common floating gate;

a capacitor having a first terminal forming a control gate and a second terminal coupled to the common floating gate;

an NMOS transistor having a source coupled to Vss, a drain, a channel formed between its source and drain, and a tunneling oxide region overlying its channel, wherein the common floating gate overlies its tunneling oxide region; and a PMOS transistor having a source, a drain coupled to the drain of the NMOS transistor, a channel formed between its source and drain, and a tunneling oxide region overlying its channel, wherein the common floating gate overlies its tunneling oxide region; and a PMOS pass transistor having a drain coupled to the source of the PMOS transistor, a source, and a gate.

2. The memory cell of claim 1 wherein the source of the PMOS pass transistor is coupled to a voltage reference, and the memory cell further comprises cell implants utilized in the PMOS and NMOS transistors so that the magnitude of the threshold of each of the PMOS and NMOS transistors is substantially equal to one half of the voltage of the voltage reference.

3. A method of programming and erasing a CMOS memory cell including an NMOS transistor and PMOS transistor having drains connected together and a common floating gate, and a capacitor connecting a control gate to the common floating gate, wherein programming results in electrons being removed from the common floating gate, programming comprising the steps of:

applying a voltage between the control gate and the source of the PMOS transistor so that electrons transfer from the common floating gate to the source of the PMOS transistor; and creating a high impedance at the source of the NMOS transistor to prevent electrons from transferring between the common floating gate and the source of the PMOS transistor, and wherein erasing results in electrons being added to the common floating gate, erasing comprising the steps of:

applying a voltage between the control gate and the source of the NMOS transistor so that electrons from the source of the NMOS transistor transfer to the common floating gate; and creating a high impedance at the source of the PMOS transistor to prevent electrons from transferring between the common floating gate and the source of the PMOS transistor.

4. A method of programming and erasing a CMOS memory cell including an NMOS transistor and PMOS transistor having drains connected together and a common floating gate, a capacitor connecting a control gate to the common floating gate, and a PMOS pass transistor having a drain coupled to the source of the PMOS transistor, wherein programming results in electrons being removed from the common floating gate, programming comprising the steps of:

applying a voltage between the control gate and the source of the PMOS pass transistor so that electrons can transfer from the common floating gate to the source of the PMOS transistor;

applying a voltage to the gate of the PMOS pass transistor so that the voltage on the source of the PMOS transistor becomes substantially equal to the voltage on the source of the PMOS pass transistor; and creating a high impedance at the source of the NMOS transistor to prevent electrons from transferring between the common floating gate and the source of the PMOS transistor, and wherein erasing results in electrons being added to the common floating gate, erasing comprising the steps of:

applying a voltage between the control gate and the source of the NMOS transistor so that electrons from the source of the NMOS transistor transfer to the common floating gate; and creating a high impedance at the source of the PMOS pass transistor while applying a voltage to the gate of the PMOS pass transistor to prevent electrons from transferring between the common floating gate and the source of the PMOS transistor.

5. A method of programming a CMOS memory cell including an NMOS transistor and PMOS transistor having drains connected together and a common floating gate, and a capacitor connecting a control gate to the common floating gate, wherein programming results in electrons being removed from the common floating gate, programming comprising the steps of:

applying a voltage between the control gate and the source of the PMOS transistor so that the source of the PMOS transistor is at a higher potential than the control gate so that electrons transfer from the common floating gate to the source of the PMOS transistor; and controlling the source of the NMOS transistor to prevent electrons from transferring between the common floating gate and the source of the PMOS transistor.

6. The method of claim 5 wherein the step of controlling the source of the NMOS transistor includes applying a high impedance to the source of the NMOS transistor.

7. A method of erasing a CMOS memory cell including an NMOS transistor and PMOS transistor having drains connected together and a common floating gate, and a capacitor connecting a control gate to the common floating gate, wherein erasing results in electrons being added to the common floating gate, erasing comprising the steps of:

applying a voltage between the control gate and the source of the NMOS transistor so that the control gate is at a higher potential than the source of the NMOS transistor so that electrons from the source of the NMOS transistor transfer to the common floating gate; and controlling the source of the PMOS transistor to prevent electrons from transferring between the common floating gate and the source of the PMOS transistor.

8. The method of claim 7 wherein the step of controlling the source of the PMOS transistor includes applying a high impedance to the source of the PMOS transistor.

* * * * *